(12) United States Patent
Chen

(10) Patent No.: US 8,390,373 B2
(45) Date of Patent: Mar. 5, 2013

(54) ULTRA-HIGH EFFICIENCY SWITCHING POWER INVERTER AND POWER AMPLIFIER

(75) Inventor: Xue Jian Chen, Shenzen (CN)

(73) Assignee: MUSIC Group IP Ltd., Tortola (VG)

( * ) Notice: Subject to any disclaimer, the term of this patent is extended or adjusted under 35 U.S.C. 154(b) by 402 days.

(21) Appl. No.: 12/838,268

(22) Filed: Jul. 16, 2010

(65) Prior Publication Data

US 2011/0299309 A1    Dec. 8, 2011

Related U.S. Application Data

(60) Provisional application No. 61/352,820, filed on Jun. 8, 2010.

(51) Int. Cl.
*H03F 3/38* (2006.01)
(52) U.S. Cl. .......................... 330/10; 330/251
(58) Field of Classification Search .............. 330/10, 330/207 A, 251
See application file for complete search history.

(56) References Cited

U.S. PATENT DOCUMENTS

| | | | |
|---|---|---|---|
| 4,961,128 A | | 10/1990 | Bloom |
| 5,225,789 A | * | 7/1993 | Caine et al. .................. 330/10 |
| 6,600,376 B1 | * | 7/2003 | Yang .............................. 330/10 |
| 7,642,758 B2 | | 1/2010 | Morong et al. |
| 2003/0095000 A1 | * | 5/2003 | Ramage et al. ................ 330/10 |
| 2003/0178889 A1 | | 9/2003 | Algrain et al. |
| 2004/0000947 A1 | * | 1/2004 | Luu ................................ 330/10 |
| 2008/0175024 A1 | | 7/2008 | Schlecht et al. |
| 2010/0109436 A1 | | 5/2010 | Lanni |
| 2010/0135045 A1 | | 6/2010 | Inoue |

OTHER PUBLICATIONS

Written Opinion, mailed Nov. 25, 2011, for PCT/IB 11/01168, 10 Pages.

* cited by examiner

*Primary Examiner* — Khanh V Nguyen
(74) *Attorney, Agent, or Firm* — Seed IP Law Group PLLC

(57) ABSTRACT

An apparatus for providing a power output proportional to a source signal, including a phase modulator driving an upper and an lower power driver with carrier waveforms having a relative phase difference and having a signal modulated thereon, and coupled to a resonator circuit to operate as a substantially zero-voltage zero-current switching element, with the output fed into respective upper and lower transformers. Identical symmetrical secondary circuits on the transformers have a rectifier stage electrically connected to an inductor in series with an upper capacitor to form an upper low pass filter, and a high speed semiconductor switch coupled to a node between the inductor and rectifier stage provides a return path to ground. The lower secondary circuit inductor is highly coupled (>=0.99) to the upper inductor, and an output formed across the upper and lower output elements is isolated from rail voltage and balanced with bi-directional current.

32 Claims, 6 Drawing Sheets

ULTRA-HIGH EFFICIENCY SWITCHING POWER INVERTER AND POWER AMPLIFIER

CROSS-REFERENCE TO RELATED APPLICATION

This application claims the benefit under 35 U.S.C. §119 (e) of U.S. Provisional Patent Application No. 61/352,820 filed Jun. 8, 2010, which provisional application is incorporated herein by reference in its entirety.

BACKGROUND

1. Technical Field

The present disclosure relates in general to power conversion systems and, in particular, to a high-efficiency single stage inverter or amplifier.

2. Description of the Related Art

BRIEF SUMMARY

The present disclosure is generally directed to power supply circuits and, in one embodiment, to a single stage power supply or power amplifier that achieves ultra-high efficiency.

In accordance with one aspect of the present disclosure, an apparatus is provided for generating a power output proportional to a source signal. The apparatus includes a phase modulator that controls upper and lower power drivers that, in turn, drive upper and lower transformers. The upper and lower transformers serve to at least electrically isolate the output from the input voltage and may also be used to provide gain or impedance matching or both on the output by altering the turns ratios. Furthermore, in the present disclosure, the phase difference between the carrier signals for the upper and lower power drivers can be used to "fine tune" the output voltage. Yet, because the phase modulator preferably utilizes carriers with fixed predetermined duty cycles, the complexity of the modulator and the rest of the circuitry is avoided. Furthermore, phase shift power conversion in the present disclosure does not generally generate any cross-over distortion especially in comparison with most previous power amp topologies.

The circuitry on the secondary side of each of these upper and lower transformers is substantially symmetrical and includes a rectifier stage electrically connected to an inductor in series with a capacitor to form a low pass filter (having a corner frequency substantially greater than the frequency of the source signal and less than the frequency of the carrier generated by the phase modulator), which further serves to integrate the source signal. The secondary circuitry also includes a semiconductor switch electrically connected to the electrical junction between the inductor and rectifier stage to provide a return path for high-frequency current to ground. Using these semiconductor switches also allows the output to achieve bi-directional current flow.

The inductors associated with the upper and lower secondary circuits are highly coupled (i.e., greater than or equaled to 0.99) to one another. In a preferred embodiment, the upper and lower inductors are both wound on the same core, which may be, for example, an E-core or torroidal. Moreover, the semiconductor switches are preferably physically disposed within the magnetic field generated by the upper and lower inductors such that these semiconductor switches also operate as substantially zero-voltage zero-current switching elements. Furthermore, using the coupled inductors with semiconductor switches allows the circuit to achieve bi-directional energy circulation.

In some embodiments the apparatus may also include current sensing circuits operably connected to measure current output of the upper and lower power drivers to provide feedback to the phase modulator to provide over current protection.

In other embodiments, the apparatus may further use an error correction circuit operably connected between the fully balanced differential output and the phase modulator to reduce distortion and correct balance. In certain embodiments that include a power factor correction circuit, a damping control may be operably connected between the error correction circuit and the power factor correction circuit to adjust the DC rail voltage output by thee power factor correction circuit.

As will be readily appreciated from the foregoing, among other aspects of the present disclosure, all of the switching elements (on both the primary and secondary side of the apparatus) are operated as substantially zero-voltage zero-current switching elements. This "soft" switching is not only more efficient, but it also reduces EMC noise. Moreover, the present inventive circuitry does not require separate power supply and switching power amplification stages, thus avoiding additional component costs and added space requirements. Furthermore, because there is no high voltage DC source required on the secondary side of the transformer, there is no risk off an over voltage situation in the disclosed topology. Also, because the present disclosure uses two switching transformers and symmetrical circuitry in the secondary, it produces a fully balanced differential output formed across the output of the upper and lower secondary circuits.

BRIEF DESCRIPTION OF THE SEVERAL VIEWS OF THE DRAWINGS

Various embodiments of the disclosure are now described, by way of example only, with reference to the accompanying figures.

Figure 1A:
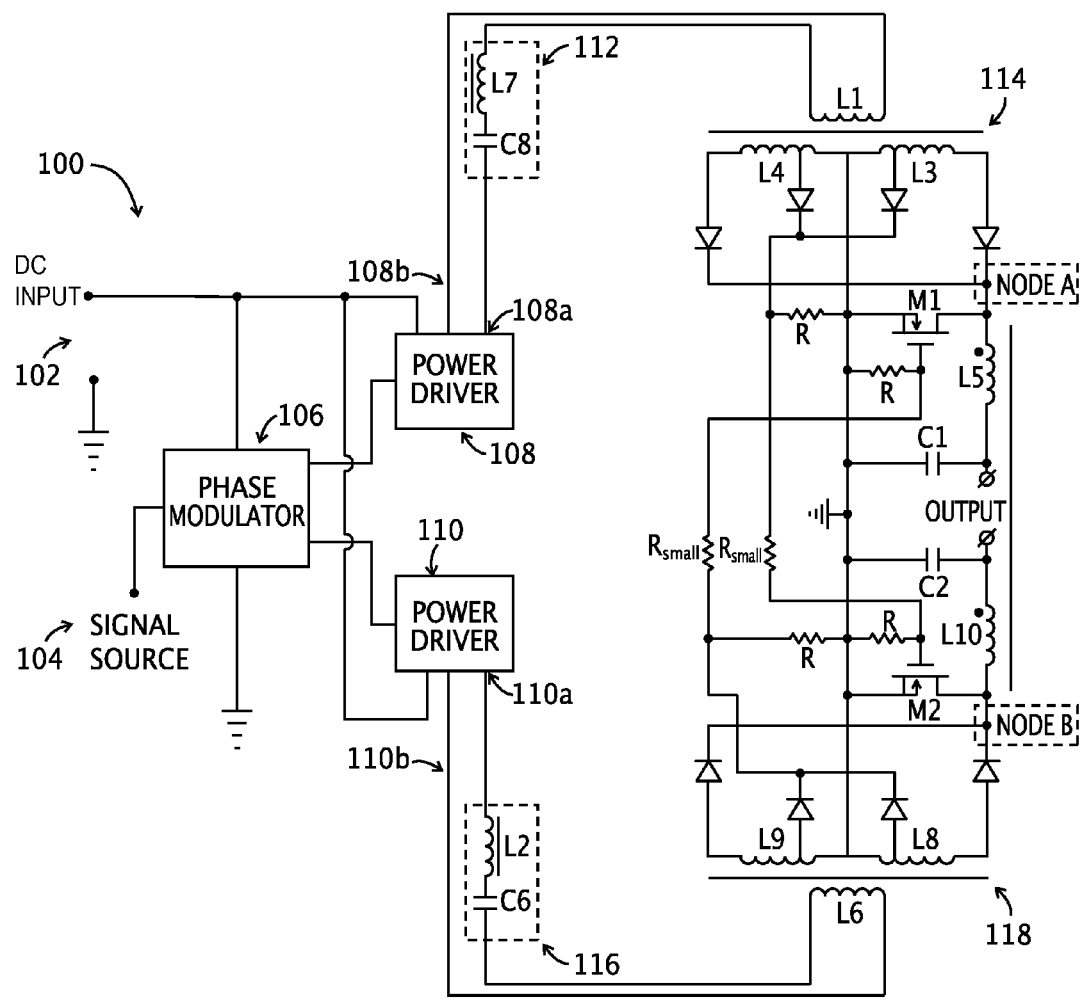
FIG. 1A shows one embodiment of a system in accordance with the present disclosure.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help improve the understanding of various embodiments of the present disclosure. Also, common but well-understood elements that are useful or necessary in a commercially feasible embodiment are not often depicted in order to facilitate a less obstructed view of these various embodiments of the present disclosure. It will be further appreciated that certain actions and/or steps may be described or depicted in a particular order of occurrence while those skilled in the art will understand that such specificity with respect to sequence is not actually required. It will also be understood that the terms and expressions used herein are to be defined with respect to their corresponding respective areas of inquiry and study except where specific meaning have otherwise been set forth herein.

Throughout the specification and claims, the phrase "in one embodiment" does not necessarily refer to the same embodiment, although it may. Similarly, the phrase "in another embodiment" as used herein does not necessarily refer to a different embodiment, although it may. As described herein various embodiments of the disclosure may be readily combined, without departing from the scope or spirit of the disclosure.

DETAILED DESCRIPTION

In accordance with one aspect of the present disclosure, a novel power converter design and system are provided that may be utilized for various devices, including inverters, converters, amplifiers, motor drivers, and the like. In general, the system operates by receiving a signal from a source that is separately modulated on two substantially similar (preferably identical), periodic alternating signals with a fundamental frequency or high frequency signal that is substantially greater than the frequency of the signal. Thus, each of the high frequency signals acts as carrier. The phases of these carrier signals may be shifted relative to one another (for example, from 1° to 89°) to provide some of the gain across the output in the secondary. As discussed further below, the overall circuit output is based on the phase difference between these signals.

Each of the two modulated high-frequency signals are fed into a respective resonator circuit on the primary side that establishes the necessary electrical conditions for substantially zero voltage and zero current switching. Each of the signals are then fed into the primary winding of a respective transformer. The transformer provides isolation and may also be used in some implementations to provide gain (i.e., step-up or step-down transformer). The two modulated high-frequency signals are thus coupled to the secondary circuit.

The secondary circuit output is substantially symmetrical, meaning two outputs in the secondary circuit are used for a fully balanced differential output signal. Diodes in the secondary provide that the current only flows forward out of both ends of the secondary winding of each transformer toward the circuit output, ensuring current flow during nearly all of the cycle. The diodes convert both positive and negative pulses to positive pulses. As result, the carrier frequency is doubled in the secondary circuit. As would be understood by those of ordinary skill in the art, other circuits or semiconductor elements or both may be used in place of diodes to create this rectifier stage on the secondary output of the transformers. Two low pass filter circuits (such as L5/C1 and L10/C2 in FIG. 1A) are formed on each side of the output port. The values of the capacitance (C1 and C2) and inductance (L5 and L10) are selected to provide a corner frequency (associated with the low pass filter functionality of these capacitor-inductor circuits) well above (if not at least an order of magnitude above) the frequency of the anticipated output signal. These capacitor-inductor pairs (L5/C1 and L10/C2) also serve to integrate the voltages proportional to the signal source 104 across the circuit output. The inductors L5 and L10 used in the low pass filters are very closely magnetically coupled but not electrically connected. Preferably, inductors L5 and L10 have a coupling factor of 0.99 or better and are wound (preferably very tightly) about the same physical core. The strong coupling and topology of these inductors serve to substantially preclude bi-directional current flow across the output of the circuit.

In addition, the magnetic field established by operation of inductors L5 and L10 facilitates the turn on of the internal body diodes in high speed semiconductor switches. By minimizing the inertia inherent in transitioning a FET front "off" to "on", hard switching of the semiconductor switches and associated power losses can be substantially avoided. This makes the electrical circuit more efficient, particularly at the cross-over points. As a result, semiconductor switches, such as M1 and M2 in FIG. 1A, operate as substantially zero-voltage switching elements. Preferably, semiconductor switches M1 and M2 are high-speed switches such as nMOS-FETs. However, the same operation can be achieved using any semiconductor switch capable of operating at the desired speeds, such as, for example, IGBTs plus additional diodes.

Thus, as will be apparent from the discussion below, this design provides substantial improvements in efficiency, as well as significant cost and space saving over existing systems.

FIG. 1A provides one embodiment of a system 100 in accordance with the present disclosure. In this embodiment, the system 100 includes a primary and a secondary stage. In the primary stage of FIG. 1A, system 100 has a DC input 102, a signal source 104, a phase modulator 106, two power drivers 108 and 110, two resonator circuits 112 and 116, and the primary coil of two switching transformers 114 and 118.

In the secondary stage of FIG. 1A, the system 100 includes the two secondary coils L3/L4 and two secondary coils L8/L9 of the two switching transformers 114 and 118, respectively, each of these secondary coils L3/L4 and L8/L9 being electrically coupled via diodes to a respective one of a first node ("Node A") or a third node ("Node B"), which are electrical connections between the respective rectifier stages and the low pass filters, and then into the low pass filters formed by a discrete inductor-capacitor pair (i.e., inductor-capacitor pair L5/C1 and L10/C2). The nominal values selected for each discrete inductor-capacitor pair L5/C1 and L10/C2 give each low pass filter a cutoff or corner frequency below the high fundamental frequency of the carriers and preferably well above the frequency of the signal. These low pass filters provide high frequency filtering in order to substantially remove the carrier signals while passing the signal from the source 104. Generally speaking, capacitors C1 and C2 in this topology only conduct a small ripple of current to ground.

Figure 1B:
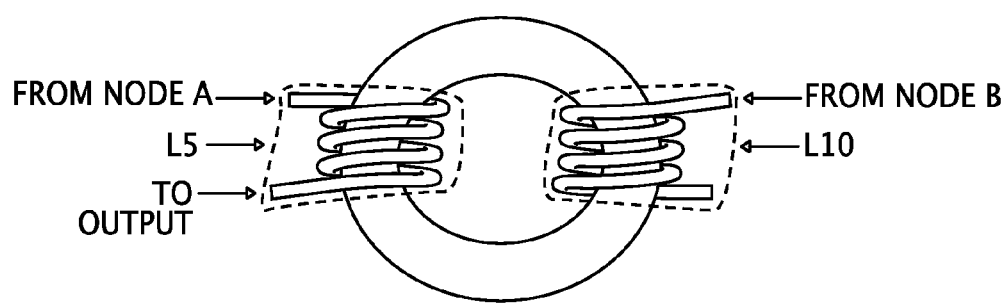
FIG. 1B shows one embodiment of a coupled inductor for use in the present disclosure.
Figure 1C:
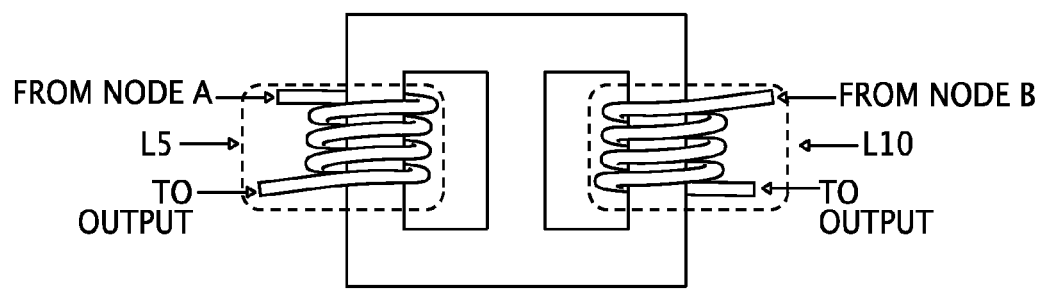
FIG. 1C shows one embodiment of a coupled inductor for use in the present disclosure.

In the circuits of FIGS. 1A-1C the inductors L5 and L10 are preferably tightly wound-about parallel legs of the same core to achieve a high coupling coefficient, which is preferably better than 0.99. With this design, L5 and L10 together provide for substantially complete energy flow in the secondary circuit of FIG. 1A. As illustrated in FIGS. 1B and 1C, the core may be torroidal or an E-core, with the E-core type being presently preferred but not limited to the core shape. The core may be made of ferrite, powder iron or any other materials for making a power inductor. Preferably, the inductance of L5 and L10 are substantially identical and in the range of 20 micro-Henries to 50 micro-Henries.

An electrical connection between the upper inductor L5 and the upper capacitor C1 forms a second node, which is a first of two output terminals, and an electrical connection between the lower inductor L10 and the corresponding lower capacitor C2 forms a fourth node, which is a second of two output terminals. The differential output signal of the circuit is output on to these two output terminals.

The secondary stage of FIG. 1A also includes semiconductor switches M1 and M2, which are preferably high-speed n-type MOSFETs (as shown in the figures).

As would be understood by those of ordinary skill in the art, semiconductor switches M1 and M2 could also be implemented using high-speed IGBTs (plus additional diodes as would be understood by those of ordinary skill in the art having the present specification before them) or any other semiconductor switch that provides high-speed switching. The gates of each of the semiconductor switches M1 and M2 are connected via $R_{small}$ and diodes to the last turn of secondary transformer coils L3 and L4 or L8 and L9, respectively.

Transistors M1 and M2 provide bi-directional high frequency current flow from Node A and Node B to ground in the operation. In the preferred embodiment, R is on the order of 100 KΩ while $R_{small}$ is on the order of 10Ω. The transistor M1/M2 circuitry is configured such that at any time either transistor M1 or M2 is conducting, but preferably not both at the same time.

The DC input may be supplied by any DC source, such as a battery, a half-bridge or full-bridge rectifier that converts an alternating current (AC) to DC (also often referred to as an AC/DC converter), or the like. The amplitude of the DC voltage may be a matter of design choice based on the intended application for the system 100, although it is generally contemplated that the DC voltage may be on the order of several hundred volts.

The signal input at the signal source input 104 may also be any type of signal depending on the application for which the system 100 is being utilized.

For instance, in an embodiment where the system 100 is to be utilized as part of an DC-AC inverter, the signal source may be generated by a sine wave generator. On the other hand, in an embodiment where the system 100 is to be utilized as part of a power amplifier, the signal source may be comprised of an audio signal (generally thought of as ranging from 40 Hz to 20 kHz) that is to be amplified by the system 100. Of course, other signals may be utilized with the system 100; however, those signals should preferably have a fundamental frequency that is at least one order of magnitude lower than the fundamental frequency of the carrier signals.

A phase modulator 106 generates alternating, periodic signals (also referred to herein as carrier signals or carriers) that have substantially the same duty cycle and frequency, with power driver outputs 108a and 110a indicating the HIGH output terminal of each respective power driver, and outputs 108b and 110b indicating the low output terminal, respectively. Each power driver is driven by the phase modulator, which may be used to control the maximum amplitude voltage of the signal generated by each power driver 108, 110. In one preferred embodiment, each power driver 108, 110 is driven by phase modulator 106 to generate a square wave having a 50% duty cycle. The fundamental frequency of the signal produced by phase modulator 106 is based on the application in which the circuit is to be utilized, and it is preferably at least one order of magnitude greater than the frequency of the signal source.

For example, in an embodiment where the signal source has a frequency of 60 Hz, it is desirable that the frequency of the signals produced by the power drivers 108 and 11.0 be at least 600 Hz, and preferably more than 1 kHz. Similarly, in an embodiment where the signal source may be an audible signal—which is generally understood to be within a range of 20 Hz to 20 kHz—it is desirable that the frequency of the carrier signals produced by the phase modulator 106 be at least 200 kHz, and more preferably between 400 kHz and 1 MHz.

Utilizing a higher frequency range for the carrier signals output by the phase modulator 106 provides multiple advantages. First, it provides sufficient separation between the carrier frequency and the frequency of the signal source to enable the power frequency or carrier frequency to be filtered out at the output 120. Second, higher carrier frequencies allow for the use of smaller transformers 114 and 118, thus further decreasing the expense, weight, and physical footprint of the system 100.

Square wave drivers are well-known in the art, and it is contemplated that any type of square wave-driver may be used. For instance, each power driver may be: a push pull circuit utilizing MOSFETs (or other field effect transistors), a full-bridge circuit, a half-bridge circuit, or the like. In yet another embodiment, the power drivers 108 and 110 may also be configured to produce other types of periodic signals (not limited to square wave) so long as each phase modulator 106 provides substantially the same periodic signal with substantially the same duty cycle and same fundamental frequency.

The phase modulator 106 is configured to receive the signal source 104, generate first and second carrier signals, and control the phase modulation and relative phase between the carrier signals. In one embodiment, the phase modulator 106 is preferably a digital phase modulator formed by a digital signal processor (DSP) that samples the signal source 104 at a predetermined rate. Any sampling rate may be used, as it need not be related to the frequencies used in any of the system components, with higher sampling rates being preferred in order to achieve lower distortion of the input signal 104. In an alternative embodiment, an analog phase modulator may be used instead. In the embodiment of FIG. 1A, the phase modulator 106 is also shown as being powered from the DC signal, although it is contemplated that a separate power source may also be provided.

Each switching transformer 114, 118 preferably includes a primary winding L1, L6 operably connected to a respective power driver 108, 110, and a secondary winding L3/L4, L8/L9 operably connected to forward-biased rectifier stage in the secondary. These transformers 114, 118 provide electrical isolation of the circuit output 120 from the supply voltage and virtually eliminates any potential over voltage situation at the output 120. By utilizing the two separate transformers 114, 118, a fully balanced differential output is also achieved by the circuit. As is well understood by those in the art, a balanced output is desirable because, among others, it permits the use of longer cables while reducing susceptibility to external noise. This is particularly advantageous in audio applications and lengthy power transmission lines.

In FIG. 1A, the primary and secondary windings of the transformers 114, 118 are illustrated as utilizing the same number of windings. However, it is contemplated that the transformers 114, 118 may be step-up or step-down transformers, in which case the primary and secondary windings would have different numbers of turns. By altering the number of turns in the transformers 114, 118, the amount of signal gain at the output 120 can be increased or decreased in order to achieve a desired voltage range across the output 120 and to match the output impedance, as may be desired. In order to provide complete isolation, it is also desirable that the primary and secondary winding of each switching transformer 114, 118 be separated by a minimum physical distance that is considered sufficient to provide isolation up to 3000V AC. In one embodiment, the transformers 114, 118 may also utilize a ferrite core, although other cores may also be used, including but not limited to air cores. It is also contemplated that the internal stray elements of the transformers may be used to aid in filtering noise.

The operation of the system 100 is as follows. The phase modulator 106 generates two substantially similar alternating signals that are between 1°-89° out of phase with one another and have an amplitude based on the DC power supply. At 1° and 89° of relative phase difference the circuitry of FIG. 1A will result in maximum voltage gain (exclusive of any gain generated in the transformers) whereas a 45° phase difference will result in practically no output voltage at the circuit output 120. This is because the output is a balanced output formed by two nodes each comprising the voltage of their respective one of the two substantially symmetrical circuits of the secondary. In this manner, the voltage differential between the two nodes establishes the output voltage (or signal) at any given time in the periodic cycle of the carrier generated by the phase modulator 106. Accordingly, where the phase difference between the carriers generated by the phase modulator 106 in the primary is 45°—because of the frequency doubling in the secondary of FIG. 1A—there will be no voltage differential at any point in the periodic cycle between the signals on the nodes collectively forming the circuit output 120. Thus, one or more control signals (not shown) fed to the phase modulator 106 control the relative phase shift between the carrier waves, which, in turn, controls the aspect of the gain across the output terminals 120 that is proportional to the phase shift. Thus, by continuously or periodically adjusting the phase shift on the outputs of the phase modulator 106, an output signal can be generated that is proportional to the signal source 104. The voltage range of the output signal 120 can also be adjusted by varying either the DC input level or, as noted above, by varying the turns ratio between the primary and secondary windings of the switching transformers 114 and 118. Furthermore, any signal received on the signal source 104 by the phase modulator 106 modulates the carrier waves relative to the signal source 104.

The above-described circuit design can be utilized to efficiently provide amplification of an external power source, invert a DC signal to an AC signal, motor drive, or the like. The use of phase shifting to control the gain of the output signal also provides numerous advantages. For example, it enables the system to provide highly efficient power conversion. It also virtually eliminates cross-over distortion that is common in many present day power-amplifier circuits that utilize switching transistors. Soft-signal clipping and audio signal gain compression can also be achieved by limiting the phase shift range of the phase modulator. Most importantly, the present disclosure has all switching devices working in a substantially zero voltage and zero current condition, which is unachievable in at least the prior art class D amplification structures.

Figure 2:
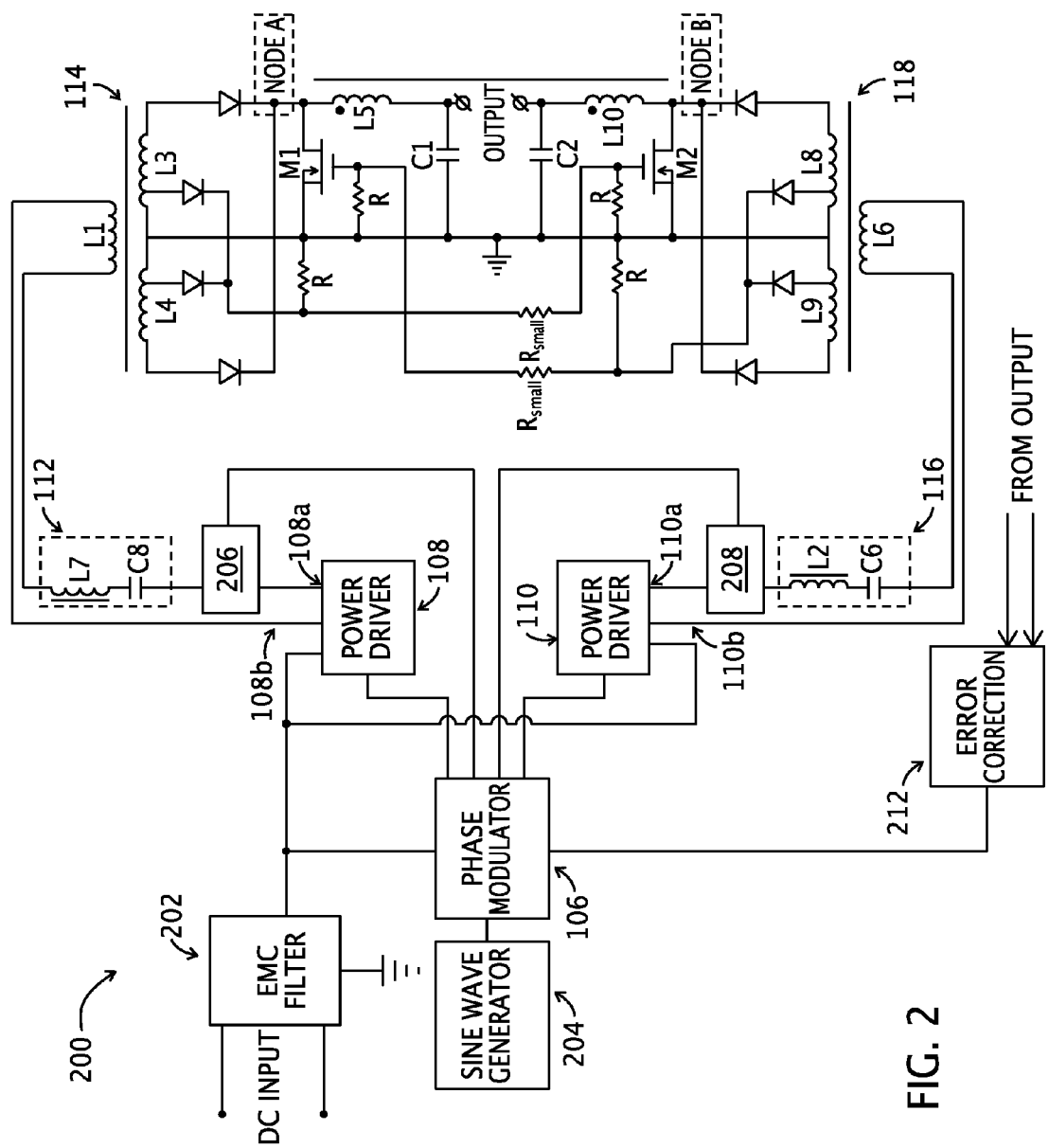
FIG. 2 shows one embodiment of a single stage, high efficiency, DC-AC inverter in accordance with the present disclosure.

FIG. 2 illustrates one embodiment of a single stage DC-AC inverter 200 utilizing the circuit design of the present disclosure. The inverter 200 includes a phase modulator 106, two power drivers 108, 110, and two switching transformers 114, 118 that operate in a manner similar as described above with respect to the system 100 of FIGS. 1A-1C. In this embodiment, the DC input is supplied from an external DC power source and passed through a filter, such as an EMC filter 202. The signal source is provided by a sine wave generator 204. The frequency of the sine wave output by the sine wave generator 204 is a matter of design choice based on the frequency of the AC signal desired at the output 120. For instance, as non-limiting examples, consumer devices in many parts of the world generally operate on a 50 Hz AC signal. In such cases, the sine wave generator may be configured to produce a 50 Hz sine wave. In America, by contrast, consumer devices are generally configured to operate on a 60 Hz signal. In yet another embodiment, the sine wave generator may be configured to utilize frequencies between 10-30 Hz in order to operate fluorescent lamps.

As shown in the embodiment of FIG. 2, the DC-AC inverter may also include one or more optional components in accordance with the present disclosure. These may include current sensing circuits 206, 208 and an output error correction circuit 212. In one embodiment the current sensing circuits 206, 208 may be coupled to a respective power driver 108, 110 to provide a feedback loop to the phase modulator 106 to provide over-current protection. Various configurations of current sensing circuits are well known in the art and will not be described in detail herein. For example, in an embodiment where the power driver is a push-pull MOSFET configuration, each current sensing circuit 206, 208 may be a single resistor. As a result, full over current protection can be achieved using a very simple and cost-effective current sensing circuit. Of course, the current sensing circuit may include other components for other types of power drivers as would be understood by those in the art.

In the embodiment of FIG. 2, the secondary is identical in design and operation to the secondary discussed with respect to FIG. 1A. However, in this embodiment, the error correction circuit 212 may be provided to create a feedback loop from the output 120 to the phase modulator 106 in order to reduce distortion and correct balance.

Figure 3:
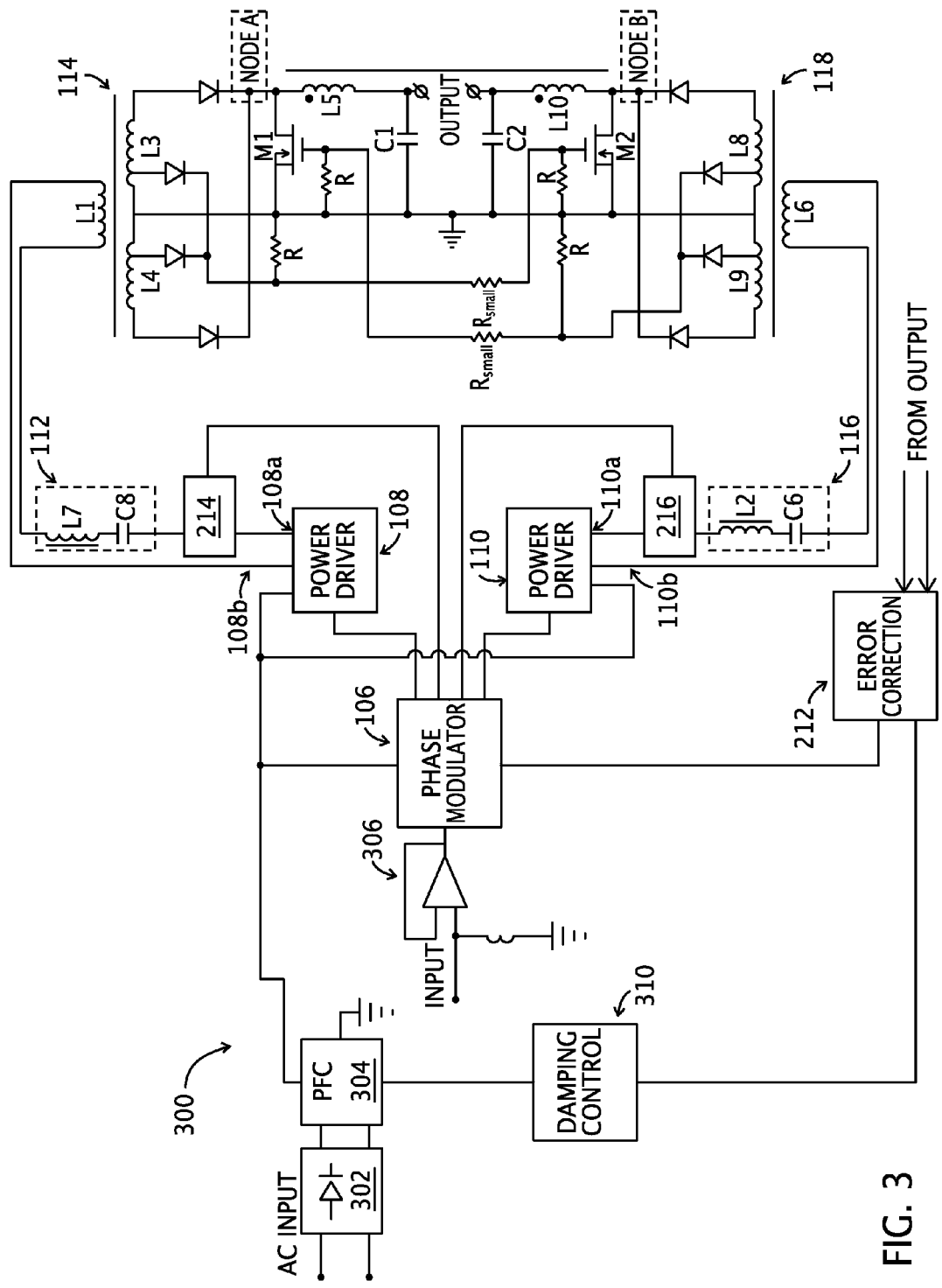
FIG. 3 shows one embodiment of a single stage, high efficiency, amplifier in accordance with the present disclosure.

FIG. 3 illustrates one embodiment of a single stage power amplifier 300 in accordance with the present disclosure. Amplifier 300 includes a phase modulator 106, two power drivers 108, 110, and two switching transformers 114, 118 that operate in a manner similar as described above with respect to the system 100 of FIG. 1A.

In this embodiment, the DC input to the amplifier 300 is provided by an input rectifier 302 that converts an AC input into a DC signal, and then passed through a power factor correction circuit 304. Any type of power factor correction circuit may be used, which are well known in the art. For example, the power factor correction circuit 304 may include an automatic power factor correction unit (for example, one or more capacitors that are switched by contactors, which are in turn controlled by a regulator that measures a power factor of the network); a passive power factor correction unit (for example, an inductor); an active power factor correction unit (for example, a boost converter, a buck converter, or a buck-boost converter); or the like.

In the system of FIG. 3, the signal source is provided from an external audio source and passed through an audio input stage 306. In the illustrated embodiment, the audio input stage 306 may be an op-amp, although any other audio input stage 306 may also be used. The external audio source may be any source that is to be amplified using the power amplifier 300.

As shown, the amplifier 300 may also include optional current sensing circuits 206 and 208 and an output error correction circuit 212, which operate in a similar manner to that described for FIG. 2. In addition, as shown in FIG. 3, the output correction circuit 212 may also be coupled to a damping control 310, which is in turn coupled to the power factor correction circuit 304. The damping control 310 utilizes the error signal provided from the output correction circuit 212 to control the damping factor of the amplifier, which can then be used to adjust the voltage being output from the power factor correction circuit. By controlling the input voltage output the power factor correction circuit based on a load on the output 120, the sound quality at output 120 can be improved.

Figure 4:
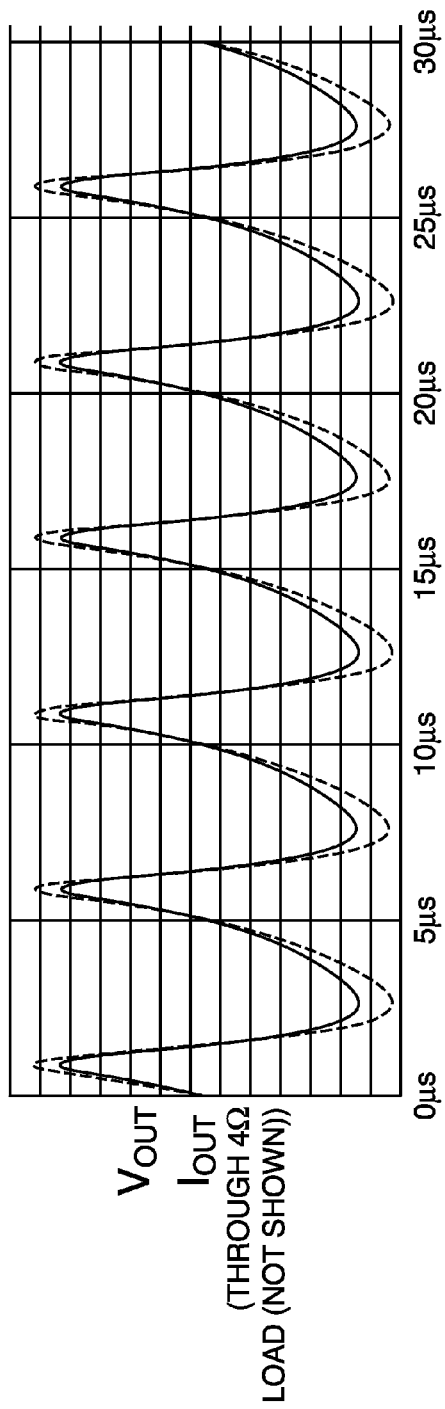
FIG. 4 shows voltage and current waveforms across the output as produced by LTspice IV software modeling of one particular implementation of the circuit of FIG. 1A.
Figure 5:
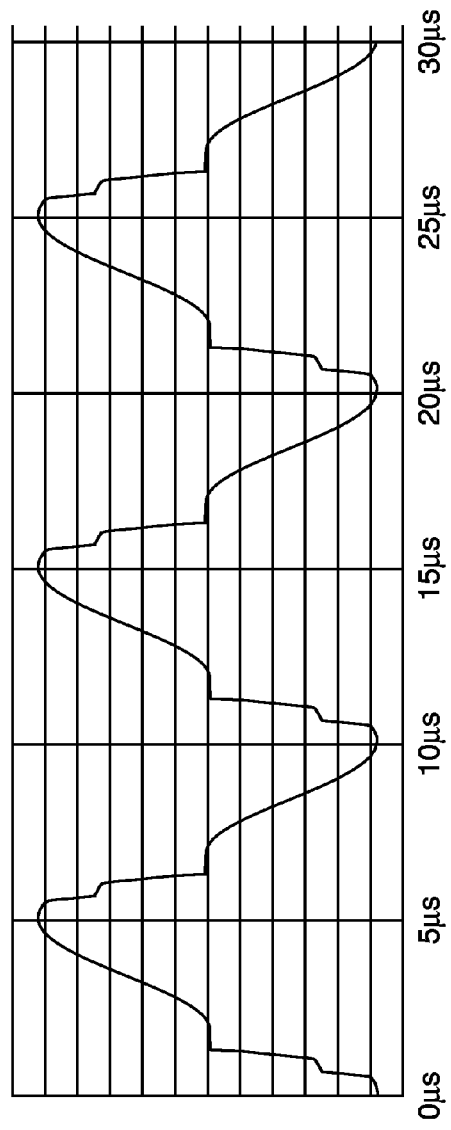
FIG. 5 shows a current waveform through L2 as zero voltage and zero current switching produced by LTspice IV software modeling of one particular implementation of the circuit of FIG. 1A.
Figure 6:
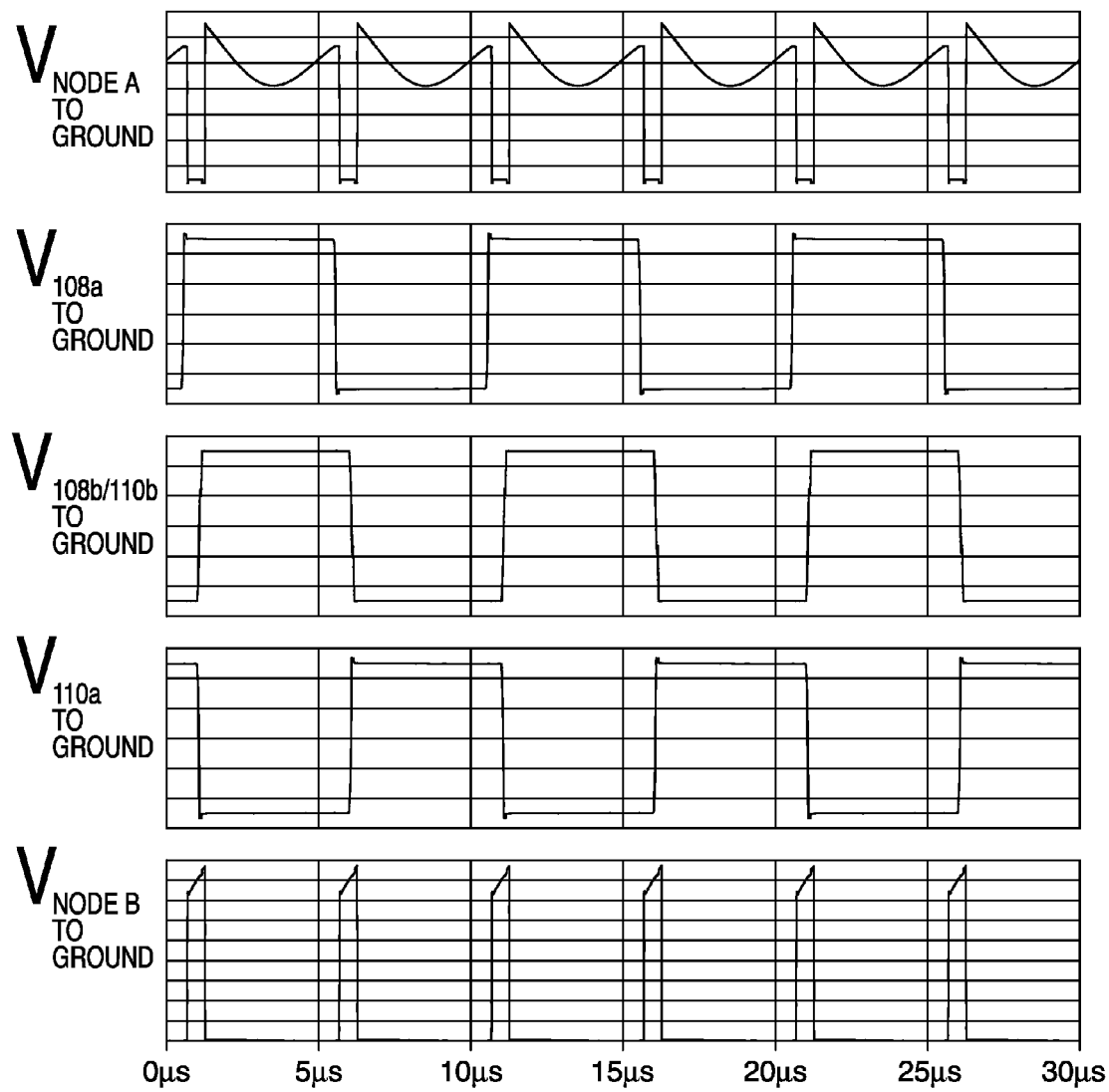
FIG. 6 shows voltage waveforms at various nodes in one particular implementation of the circuit of FIG. 1A, as produced by LTspice IV software.

Now turning to FIGS. 4, 5 and 6, which depict various voltage and current waveforms—produced by LTspice IV modeling software—at various nodes and through various components in one particular implementation of the circuit of FIG. 1A. In particular for purposes of modeling the operation of FIG. 1A, (a) DC input voltage was selected to be 20 V; (b) a 100 kHz square wave carrier signal with a 50% duty cycle was generated in the phase modulator 106; (c) the source signal is a 60 Hz sine wave; (d) the power drivers 108, 110 were driven with a relative 10° phase difference; (e) the switching transformers 114, 118 have primary:secondary ratios of 1:1; and (f) the discrete components were assigned the following values:

| Component | Nominal Value |
|---|---|
| C1 | 1 uf |
| C2 | 1 uf |
| C6 | 10 uf |
| C8 | 10 uf |
| L1 | 500 uh |
| L2 | 2 uh |
| L3 | 500 uh |
| L4 | 500 uh |
| L5 | 20 uh |
| L6 | 500 uh |
| L7 | 2 uh |
| L8 | 500 uh |
| L9 | 500 uh |
| L10 | 20 uh |
| R5 | 4 ohms |
| R6 | 100k ohms |
| R7 | 100k ohms |

As shown in FIG. 4 this combination of variables create a periodic output voltage and current that are substantially in phase. The output voltage is nearly at 1:1 ratio to the input voltage because the transformers 114, 118 provided isolation only and the phase difference was quite small (i.e., 10°). The output current was modeled at the output by placing a 4 ohm resistor across the output terminals (not shown), which resulted in the current waveform according to SPICE. FIG. 5 shows the current through the inductor L6, which is substantially sinusoidal with the minor exception of the short zero current plateaus caused by zero-voltage crossings. This modeling verifies the power driver stage operates in a substantially zero voltage and zero current switching condition.

Various voltages (as indicated in the axes labels) are depicted in the voltage vs. time graphs of FIG. 6. The three middle waveforms depict the illustrated 100 kHz square wave, the square-wave shifted approximately 10° in phase behind the second wave, and the inverse of the 10° shifted wave, each of which will be generated by phase modulator 106. By comparing the topmost and bottommost graphs of FIG. 6 it can be seen that the 10° phase shift has resulted in a wider voltage pulse at "Node A" than at "Node B." In fact, these voltage diagrams are complementary in a manner substantially reflective of the 10° phase shift in this illustrative example. Under these conditions, C1 is going to be charged to a higher potential than C2.

The systems described above may be utilized in any application that utilizes a power inverter, converter, amplifier, or the like. However, the present disclosure is particularly suited to those applications in which efficiency or energy conservation is a primary concern. For instance, it is contemplated that the present disclosure may be utilized for DC-AC conversion in battery-powered vehicles, high power AC power supplies, solar power generators, high power AC power supplies, motor control applications, space and aviation technologies, and any other energy saving DC-AC power conversion applications. The present disclosure may also be utilized for audio power amplifier applications, and to provide efficient car power amplification.

Further advantages and modifications of the above described system and method will readily occur to those skilled in the art. The disclosure, in its broader aspects, is therefore not limited to the specific details, representative system and methods, and illustrative examples shown and described above. Various modifications and variations can be made to the above specification without departing from the scope or spirit of the present disclosure, and it is intended that the present disclosure cover all such modifications and variations provided they come within the scope of the following claims and their equivalents.

What is claimed is:

1. An apparatus for providing a power output proportional to a source signal, the source signal having a source frequency, the apparatus comprising:

a phase modulator structured to generate first and second carrier signals each having substantially identical carrier waveforms, carrier frequencies, and duty cycles, the first and second carrier signals having a relative phase difference, the phase modulator further structured to modulate the first and second carrier signals by the source signal and output first and second modulated carrier signals;

an upper transformer and a lower transformer, the upper transformer having an upper transformer primary winding and an upper transformer secondary winding and the lower transformer having a lower transformer primary winding and a lower transformer secondary winding, the upper and lower transformers structured to be substantially electromagnetically identical to one another and to provide electrical isolation between primary and secondary stages of the apparatus;

an upper power driver circuit structured to be driven by the first modulated carrier signal and drawing power from a DC supply to output a powered modulated carrier signal to the upper transformer primary winding, the upper power driver circuit operably coupled to an upper resonator circuit, the upper power driver circuit structured to operate as a substantially zero-voltage zero-current switching element;

a lower power driver circuit structured to be driven by the second modulated carrier signal and drawing power from the DC supply to output a powered modulated carrier signal to the lower transformer primary winding, the lower power driver circuit operably coupled to a lower resonator circuit, the lower power driver circuit structured to operate as a substantially zero-voltage zero-current switching element;

an upper secondary circuit electrically coupled to the upper transformer secondary winding, the upper secondary circuit winding having an upper rectifier stage electrically coupled to an upper inductor in series with an upper capacitor to form an upper low pass filter having a corner frequency greater than the source frequency and less than the first and second carrier signals, the upper low pass filter further structured to integrate a voltage proportional to the source signal, an upper semiconductor switch coupled to ground and to a first node between the upper inductor and the upper rectifier stage and structured to provide a return path for high-frequency current to ground, an upper output element coupled to a second node between the upper inductor and the upper capacitor;

a lower secondary circuit coupled to the lower transformer secondary winding, the lower secondary circuit including a lower rectifier stage coupled to a lower inductor in series with a lower capacitor to form a lower low pass filter structured to have a corner frequency substantially greater than the source frequency and less than the first and second carrier signal frequencies, the lower low pass filter further structured to integrate a voltage proportional to the source signal, a lower semiconductor switch coupled to a third node between the lower inductor and the lower rectifier stage and structured to provide a return path for high-frequency current to ground, a lower output element coupled to a fourth node between the lower inductor and lower capacitor;

wherein the upper and lower inductors are structured to be magnetically coupled to one another, and the upper and lower semiconductor switches are structured to be physically disposed within a magnetic field generated by the upper and lower inductors such that both the upper and lower semiconductor switches are structured to operate as substantially zero-voltage zero-current switching elements, with the upper and lower semiconductor switches structured to conduct at substantially complementary times when controlled by an increase in positive voltage on a respective one of the upper and the lower transformer secondary windings; and output terminals at the upper and lower output elements on which a fully balanced differential output signal is generated.

2. The apparatus according to claim 1 wherein the upper and lower transformers have coil turn ratios that are substantially the same.

3. The apparatus according to claim 1 wherein coil turns ratios for the upper and lower transformers are structured to achieve a desired output voltage range.

4. The apparatus according to claim 3 wherein the output is structured as a fully differential output and the coil turns ratios are further structured to match a desired impedance on the fully balanced differential output signal.

5. The apparatus according to claim 4 wherein the relative phase difference is adjustable to achieve a desired output voltage range while maintaining a desired impedance on the fully balanced differential output signal.

6. The apparatus according to claim 1 wherein coil turns ratios of the upper and lower transformers are structured to match a desired impedance on the fully balanced differential output signal.

7. The apparatus according to claim 1 wherein the first and second carrier signals generated by the phase modulator have a fixed duty cycle.

8. The apparatus according to claim 1 wherein the source signal is a data signal containing frequencies of less than 20 kHz, and the phase modulator is structured to run at a fundamental frequency that is two or more multiples of 20 kHz.

9. The apparatus according to claim 1 wherein the upper and lower inductors are both wound on a same core.

10. The apparatus according to claim 9 wherein the core is an E-core.

11. The apparatus according to claim 9 wherein the core is a toroid.

12. The apparatus according to claim 1 further comprising an upper current sensing circuit coupled to the upper power driver and structured to measure current output of the upper power driver and to provide feedback to the phase modulator to provide over current protection.

13. The apparatus according to claim 12 further comprising a lower current sensing circuit coupled to the lower power driver and structured to measure current output of the lower power driver and to provide feedback to the phase modulator to provide over current protection.

14. The apparatus according to claim 1 further comprising an error correction circuit coupled between the fully balanced differential output signal and the phase modulator and structured to reduce distortion and correct balance.

15. The apparatus according to claim 14 further comprising a power factor correction circuit and a damping control coupled between the error correction circuit and the power factor correction circuit and structured to adjust a DC rail voltage output by the power factor correction circuit.

16. The apparatus according to claim 1 wherein the upper and lower rectifier stages are structured to respectively double the carrier frequencies of the first and second carrier signals found in the upper and lower secondary circuits.

17. The apparatus according to claim 16 wherein the upper and lower rectifier stages are formed using a plurality of discrete diodes.

18. The apparatus according to claim 17 wherein the output is structured to conduct bi-directional current flow due to the interaction of the upper and lower semiconductor switches and the upper and lower inductors that are highly coupled to one another.

19. A circuit, comprising:
first and second transformer circuits having first and second primary windings and first and second secondary windings;

a primary circuit that includes a phase modulator circuit having an input structured to receive a source signal and to output first and second modulated carrier signals having a relative phase difference that can be shifted, and first and second resonator circuits coupled to the phase modulator to received the first and second modulated carrier signals and further coupled to the respective first and second primary windings of the first and second transformer circuits; and first and second secondary circuits coupled to the respective first and secondary windings of the first and second transformers, each of the first and second secondary circuits including a rectifier stage and a low pass filter formed of a capacitor and inductor and structured to have a corner frequency substantially greater than a frequency of the source signal and less than a frequency of the first and second modulated carrier signals, each of the first and second secondary circuits further including respective first and second switches structured to provide a return path to ground, the inductors of each low pass filter of the first and second secondary circuits structured to be magnetically coupled to one another and the first and second switches structures to be physically disposed within a magnetic field generated by the magnetically coupled inductors such that the first and second switches are structured to operate as substantially zero-voltage zero-current switching elements to conduct current at substantially complimentary times and generate a fully balanced differential output signal at output terminals formed on the low pass filters.

20. The circuit of claim 19, wherein the low pass filter inductors are wound about a common core and have a coupling factor of at least 0.99, and wherein the magnetic field established by the low pass filter inductors facilitates a turn on of an internal body diode of the first and second switches.

21. The circuit of claim 20, wherein the low pass filter inductors are wound about parallel legs of the core, and the inductance of the low pass filter inductors is substantially identical.

22. The circuit of claim 19, wherein the first and second switches are structured to provide bi-directional high frequency current flow from a first node between the low pass filter inductor and rectifier stage of the first secondary circuit to ground and from a second node between the low pass filter inductor and rectifier stage of the second secondary circuit to ground, respectively.

23. The circuit of claim 19, further comprising first and second power driver circuits coupled to the phase modulator circuit to receive the respective first and second modulated carrier signals and having respective outputs coupled to the first and second primary windings of the respective first and second transformer circuits.

24. The circuit of claim 19, wherein the phase modulator is structured to output the first and second modulated carrier signals that are substantially similar alternating signals that are between 1 degree and 89 degrees out of phase with one another, and a relative phase difference of one degree and 89 degrees will result in maximum voltage gain in the fully balanced differential output signal and a 45 degree relative phase difference will result in substantially no output voltage in the fully balanced differential output signal.

25. The circuit of claim 19, further comprising a source signal generator having an output coupled to the phase modulator circuit, the source signal generator structured to generate the source signal as a sine wave signal.

26. The circuit of claim 19, further comprising first and second sensing circuits coupled to the first and second power driver circuits, respectively, to provide a feedback loop to the phase modulator that in turn is structured to provide over-current protection in response to the feedback loop provided by the first and second current sensing circuits.

27. The circuit of claim 25, further comprising an output error correction circuit receiving as input the differential output signal and having an output coupled to the phase modulator circuit to provide a feedback loop to reduce distortion and correct balance.

28. The circuit of claim 27, comprising a damping control circuit coupled to an output of the error correction circuit and having an output coupled to a power factor correction circuit coupled to the phase modulator circuit and the first and second power driver circuits, the damping control circuit structured to receive an error signal from the error correction circuit and to control a damping factor for adjusting voltage at an output of the power factor correction circuit.

29. A system, comprising:
a circuit structured to provide a power output proportional to a source signal, the source signal having a source frequency, the power output circuit comprising:
a phase modulator structured to receive the source signal and to output first and second modulated carrier signals to drive first and second power driver circuits that, in turn, are coupled to first and second primary windings, respectively, of first and second respective transformer circuits; and
first and second rectifier stages coupled to first and second secondary windings, respectively, of the respective first and second transformer circuits;
first and second low pass filters coupled to the respective first and second rectifier stages, each of the first and second low pass filters having an inductor coupled in series with a capacitor and structured to have a corner frequency substantially greater than a frequency of the source signal and less than a frequency of the first and second modulated carrier signals; and
first and second switches coupled to respective junctions between the first and second low pass filter inductors and the respective first and second rectifier stages to provide a path to ground, the switches having control terminals coupled to the respective first and second secondary windings of the first and second transformers to alternatingly conduct current at complimentary times to output terminals on the low pass filters to provide a fully balanced differential output signal, the first and second switches structured to be physically disposed within a magnetic field generated by the first and second inductors in the first and second low pass filters, such that the first and second switches are structured to operate as substantially zero-voltage zero-current switching elements, and wherein the phase modulator circuit is structured to provide a relative phase difference between the first and second modulated carrier signals that can be shifted to adjust a gain in the fully balanced differential output signal.

30. The system of claim 29, wherein the power output circuit includes first and second power driver circuits coupled in series to respective first and second resonator circuits that are coupled between the phase modulator circuit and the respective first and second primary windings of the first and second transformer circuits.

31. The system of claim 30, wherein the first and second inductors of the first and second low pass filters are wound about a same core to obtain a magnetic coupling factor of 0.99 or greater.

32. The system of claim 29, wherein the phase modulator circuit is structured to shift the relative phase difference between the first and second modulated carrier signals to be in a range from 1 degree to and including 89 degrees, and wherein the power output circuit is structured to obtain a maximum gain in the fully balanced differential output signal when the relative phase difference between the first and second modulated carrier signals is at 1 degree and at 89 degrees and to output no voltage at the fully balanced differential output signal when the relative phase difference between the first and second modulated carrier signals is at 45 degrees.

* * * * *